(12) United States Patent
Fiebag et al.

(10) Patent No.: US 6,649,319 B2
(45) Date of Patent: Nov. 18, 2003

(54) METHOD OF PROCESSING LITHOGRAPHIC PRINTING PLATE PRECURSORS

(75) Inventors: Ulrich Fiebag, Resenweg (DE); Hans-Joachim Timpe, Baumhofstr. (DE); Uwe Todock, Langer Hagen (DE); Anfreas Vihs, Bochstr. (DE)

(73) Assignee: Kodak Polychrome Graphics LLC, Norwalk, CT (US)

( * ) Notice: Subject to any disclaimer, the term of this patent is extended or adjusted under 35 U.S.C. 154(b) by 123 days.

(21) Appl. No.: 09/878,457

(22) Filed: Jun. 11, 2001

(65) Prior Publication Data

US 2003/0031948 A1 Feb. 13, 2003

(51) Int. Cl.$^7$ .............................. G03F 7/021; G03F 7/30
(52) U.S. Cl. ..................... 430/165; 430/166; 430/270.1; 430/278.1; 430/302; 430/331
(58) Field of Search ................................ 430/302, 331, 430/166, 278.1, 165, 270.1

(56) References Cited

U.S. PATENT DOCUMENTS

| 4,873,174 A | 10/1989 | Dhillon et al. | 430/309 |
|---|---|---|---|
| 4,912,021 A | 3/1990 | Dhillon et al. | 430/331 |
| 5,691,288 A | 11/1997 | Dhillon | 510/171 |
| 5,837,425 A | 11/1998 | Nakanishi et al. | 430/302 |
| 6,114,089 A | 9/2000 | Takita et al. | 430/278.1 |
| 6,132,931 A | 10/2000 | Kawamura et al. | 430/270.1 |
| 6,143,479 A | 11/2000 | Fiebag et al. | 430/331 |
| 6,165,690 A | 12/2000 | Yoshida et al. | 430/302 |

FOREIGN PATENT DOCUMENTS

| GB | 2 276 729 | 10/1994 |
|---|---|---|
| JP | 05094024 | 4/1993 |

*Primary Examiner*—John S. Chu
(74) *Attorney, Agent, or Firm*—RatnerPrestia

(57) ABSTRACT

A method of processing imageable elements useful as alkaline-developable lithographic printing plate precursors that does not require either a rinsing step or a further gumming step is disclosed. The method comprises simultaneously developing and gumming the imaged element with an aqueous alkaline developing-gumming solution comprising one or more water-soluble polyhydroxy compounds of the following structure:

$$R^1(CHOH)_nR^2$$

in which n is 4 to 7; and either (i) $R^1$ is hydrogen, aryl, or $CH_2OH$; and $R_2$ is hydrogen, alkyl group having 1 to 4 carbon atoms, $CH_2OR^3$ in which $R^3$ is hydrogen or an alkyl group having 1 to 4 carbon atoms, $CH_2N(R^4R^5)$ in which $R^4$ and $R^5$ are each independently hydrogen or an alkyl group having 1 to 4 carbon atoms, or $CO_2H$, or (ii) $R^1$ and $R^2$ together form a carbon—carbon single bond.

36 Claims, No Drawings

METHOD OF PROCESSING LITHOGRAPHIC PRINTING PLATE PRECURSORS

FIELD OF THE INVENTION

This invention relates to lithographic printing. In particular, this invention relates to a method of processing imagewise-exposed imageable elements useful as alkaline-developable lithographic printing plates using an aqueous alkaline developing-gumming solution.

BACKGROUND OF THE INVENTION

In lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Imageable elements useful as lithographic printing plates, sometimes called printing plate precursors or printing forms, typically comprise an imageable layer applied over the surface of a hydrophilic substrate. The imageable layer includes one or more radiation-sensitive components, which may be dispersed in a suitable binder. Alternatively, the radiation-sensitive component can also be the binder material.

To obtain a printing plate with imagewise distribution of printable regions, it is necessary to remove regions of an imaged imageable element. The most common method for removing the undesired regions is to contact the imaged element with a developer. If after exposure to radiation the exposed regions of the imageable layer are removed by the developer revealing the underlying hydrophilic surface of the substrate, the element is a positive-working printing element. Conversely, if the unexposed regions are removed, the element is a negative-working element. In each instance, the regions of the imageable layer (i.e., the image areas) that remain after development are ink-receptive, and the regions of the hydrophilic surface revealed by the developing process accept water and aqueous solutions, typically a fountain solution, and repel ink.

Typically, after development the imaged element must be treated with a specially formulated gumming or finisher solution to desensitize the non-image areas to assure that they will not accept ink upon printing. When a metal support is used for the imageable layer, the finisher also prevents oxidation of the non-image areas of the element during storage or while waiting for press mounting.

Many alkaline-developable positive-working imageable elements comprise a light sensitive layer comprising a phenolic resin, such as a novolac resin, on a hydrophilic substrate, typically a specially treated aluminum sheet. In one type of element, for example, the light sensitive layer comprises a novolac resin and a radiation-sensitive o-diazoquinone or diazonaphthoquinone compound, such as a naphthoquinonediazide sulfonic acid ester of a novolac resin. Upon exposure to light, the radiation-sensitive diazonaphthoquinone is converted to the corresponding carboxylic acid. The developer penetrates and removes the exposed or image regions of the imageable layer, revealing the underlying hydrophilic surface of the substrate, without substantially affecting the complimentary unexposed regions.

The conventional method for processing imageable elements useful as lithographic printing plates comprises the following steps: imagewise exposure, developing, rinsing, gumming, and drying. In case of conventional negative-working plates, "2 in 1 processing," which is described, for example, in Dhillon U.S. Pat. No. 4,873,174, can also be used. This method consists of the steps: exposure, development/gumming, drying, where development/gumming is carried-out with one solution and in one processor section. However, this method cannot be used for positive-working plates that comprise novolacs or similar resins due to the high alkalinity of the developer required for the dissolution of such resins in aqueous solutions. Residues of alkaline ingredients remaining at both image and non-image areas would lead to problems during printing and/or storage of the plates. Attempts have been made to prepare a single solution that simultaneously develops and gums positive-working plates by simply mixing typical developer and finisher compositions. However, such attempts suffer from several drawbacks, mainly from incompatibility of the components. Therefore, for positive-working plates, conventional processing is still required.

Thus, a need exists for a method for processing imageable elements useful as lithographic printing plates, especially for positive-working elements that comprise novolacs or similar resins, that does not require separate rinsing and gumming steps.

SUMMARY OF THE INVENTION

The invention is a method for forming an image. The method comprises the steps of:

(a) imaging an imageable element, the imageable element comprising an imageable layer over a hydrophilic support, and forming an imaged element comprising exposed regions and unexposed regions in the imageable layer; and (b) simultaneously developing and gumming the imaged element by contacting the imaged element with an aqueous alkaline developing-gumming solution and removing one of the exposed regions and the unexposed regions of the imageable layer;

in which:

the aqueous alkaline developing-gumming solution comprises one or more water-soluble polyhydroxy compounds of the following structure:

$R^1(CHOH)_nR^2$ in which n is 4 to 7; and either (i) $R^1$ is hydrogen, aryl, or $CH_2OH$; and $R_2$ is hydrogen, alkyl group having 1 to 4 carbon atoms, $CH_2OR^3$ in which $R^3$ is hydrogen or an alkyl group having 1 to 4 carbon atoms, $CH_2N(R^4R^5)$ in which $R^4$ and $R^5$ are each independently hydrogen or an alkyl group having 1 to 4 carbon atoms, or $CO_2H$, or (ii) $R^1$ and $R^2$ together form a carbon—carbon single bond;

the aqueous alkaline developing-gumming solution has a pH of about 10.0 to about 14; and the one or more polyhydroxy compounds comprise about 10 wt % to about 30 wt % of the aqueous alkaline developing-gumming solution.

Preferably, the method does not comprise either a rinsing step or a further gumming step following step (b). Preferably, the imageable layer comprises (i) at least one phenolic resin or at least one polymeric compound having pendent sulfonamide groups, and (ii) the hydrophilic support comprises aluminum or an aluminum alloy.

In another aspect, the invention is an imaged element useful as a lithographic printing plate formed by the method of the invention.

DETAILED DESCRIPTION OF THE INVENTION

Developing and Gumming

The aqueous alkaline developing-gumming solution comprises one or more water-soluble polyhydroxy compounds having the following structure:

in which n is 4 to 7; and
either (i) $R^1$ is hydrogen, aryl, or $CH_2OH$; and $R^2$ is hydrogen, alkyl group having 1 to 4 carbon atoms, $CH_2OR^3$ in which $R^3$ is hydrogen or an alkyl group having 1 to 4 carbon atoms, $CH_2N(R^4R^5)$ in which $R^4$ and $R^5$ are each independently hydrogen or an alkyl group having 1 to 4 carbon atoms, or $CO_2H$, or (ii) $R^1$ and $R^2$ together form a carbon—carbon single bond.

In one group of polyhydroxy compounds, $R^1$ is hydrogen or $CH_2OH$ and $R^2$ is hydrogen. In a preferred group of these polyhydroxy compounds, n is 5 or 6. This group includes the sugar alcohols, compounds of the structure $H(CHOH)_nH$, which do not carry a free aldehyde or ketone group and do not show a reducing property. The sugar alcohols may be obtained from natural sources or prepared by hydrogenation of reducing sugars. Preferred sugar alcohols include mannitol, sorbitol, xylitol, ribitol, and arabitol. Other sugar alcohols include, for example, talitol, dulcitol, and allodulcitol.

In another group of polyhydroxy compounds, $R^1$ and $R^2$ together form a carbon—carbon single bond. Included are carbocyclic compounds of the structure: $(CHOH)_n$, in which n is 4 to 7. In a preferred group of these polyhydroxy compounds, n is 5 or 6, more preferably 6. There are nine possible stereoisomers of 1,2,3,4,5,6-hexahydroxycyclohexane, several of which are naturally occurring. A preferred polyhydroxy compound is meso-inosit (cis-1,2,3,5-trans-4,6-hexahydroxycyclohexane). meso-Inosit can be isolated from corn steep liquor.

In another group of polyhydroxy compounds, $R^1$ is hydrogen, aryl, or $CH_2OH$; and $R^2$ is alkyl group having 1 to 4 carbon atoms, $CH_2OR^3$ in which $R^3$ is an alkyl group having 1 to 4 carbon atoms, $CH_2N(R^4R^5)$ in which $R^4$ and $R^5$ are each independently H or an alkyl group having 1 to 4 carbon atoms, or $CO_2H$.

In one preferred group of polyhydroxy compounds, $R^1$ is hydrogen or $CH_2OH$; and $R^2$ is $CO_2H$. More preferably, $R^1$ is H and n is 4 or 5. This group includes polyhydroxy compounds of the structure $H(CHOH)_nCO_2H$, in which n is 4 or 5. Conceptually, these polyhydroxy compounds may be produced by oxidation of the corresponding hexose or pentose sugar, i.e., oxidation of the aldehyde group of a hexose sugar such as glucose, galactose, allose, mannose, etc, or oxidation of the aldehyde of a pentose sugar such as arabinose, ribose, xylose, etc. Gluconic acid [$H(CHOH)_5CO_2H$], for example, may be prepared by oxidation of glucose by, for example, microbiological oxidation. Preferred polyhydroxy compounds include ribonic acid, gluconic acid (dextronic acid), mannonic acid, and gulonic acid.

As is known to those skilled in the art, these polyhydroxy compounds may exit in a ring-closed lactone form. Ribonic acid may exist as ribonic acid gamma-lactone. Gluconic acid may exist as gluconic acid gamma-lactone. Mannonic acid may exist as mannonic acid gamma-lactone. Gulonic acid may exist as gulonic acid gamma-lactone. The lactone form of these polyhydroxy compounds is included is the definition given above.

Also, as it apparent to those skilled in the art, in alkaline solution the polyhydroxy compound may exist as an anion [$H(CHOH)_nCO_2^-$] due to ionization of the carboxyl group ($CO_2H$) to the carboxylate anion ($COO^-$). Lactones are converted to salts of the corresponding ring-opened acids in alkaline solution. Or the compound may be supplied as a salt, especially as an alkali metal salt, such as a sodium salt [$H(CHOH)_nCO_2Na^+$], or a potassium salt [$H(CHOH)_nCO_2^- K^+$]. Anions and salts of these polyhydroxy compounds are included in the definition given above.

In another group of polyhydroxy compounds, $R^1$ is hydrogen, and $R^2$ is $CH_2N(R^4R^5)$ in which $R^4$ and $R^5$ are each independently hydrogen or an alkyl group having 1 to 4 carbon atoms. n is preferably 4 or 5, and $R^4$ and $R^5$ are preferably each independently hydrogen or an alkyl group having 1 to 2 carbon atoms. Preferred polyhydroxy compounds of this group include glucamine, N-methyl-glucamine, and 1-desoxy-1-(methylamino)-galactit. A more preferred polyhydroxy compound is N-methyl-glucamine.

The aqueous alkaline developing-gumming solution has a pH between about 10 and about 14.0, typically at least about 11, preferably at least about 12, and preferably less than 13.5. The alkalinity of the developer can be achieved by any of the conventional alkaline systems; e.g. alkali metal hydroxides, silicates, phosphates, borates, amines etc. Alkali metal hydroxides are preferred. Silicates are not favored because silicate deposits can be formed on the exposed and developed image. Consequently, the developing-gumming solution preferably does not comprise a silicate.

The total amount of polyhydroxy compounds present in the aqueous alkaline developing-gumming typically comprises about 10 wt % to about 30 wt %, more preferred about 12 wt % to about 20 wt %, based on the total weight of the aqueous alkaline developing-gumming solution. That is, if only one polyhydroxy compound is present, it typically comprises about 10 wt % to about 30 wt %, more preferred about 12 wt % to about 20 wt %, based on the total weight of the aqueous alkaline developing-gumming solution. If more than one polyhydroxy compound is present, the total amount of the polyhydroxy compounds typically is about 10 wt % to about 30 wt %, more preferred about 12 wt % to about 20 wt %, based on the total weight of the aqueous alkaline developing-gumming solution.

The developing-gumming solution may additionally comprise materials that are conventional components of developers, such as, surfactants (wetting agents), biocides (antimicrobial and/or antifungal agents), antifoaming agents, such as certain silicones, buffers, chelating (complexing) agents, etc, in a suitable amount (for example up to 5 wt % based on the total composition weight). If the developing-gumming solution is used in combination with and/or diluted with hard water, the presence of a chelating agent is preferred. Salts of ethylenediamine tetraacetic acid, for example, can be used as both a buffer and a chelating agent.

The developing-gumming solution may be a wholly aqueous solution, i.e., one that do not comprise an organic solvent, or it may comprise a small amount of one or more organic solvents, such as are disclosed in Fiebag, U.S. Pat. No. 6,143,479, incorporated herein by reference. Polyglycol derivatives with the structure:

in which $R^6$ is hydrogen or $C_1$–$C_8$ alkyl; $R^7$ is hydrogen, methyl or ethyl, $R^8$ is hydrogen or $CH_2COOH$; and y is an integer from 10 to 20, may be included. Polycondensation products of $C_2$–$C_4$ alkylene oxides with ethylene diamine may also be included. Mixture of polyglycol derivatives may also be used. Preferred polyglycol derivatives are polypropylene glycol ether, polyethylene glycol ether, polybutylene glycol ether, derivatives thereof, and mixtures thereof.

When present, the total amount of polyglycol derivative or derivatives present typically comprises about 0.0005 wt % to about 3 wt % of the developing-gumming solution, based on the total weight of the solution.

The developing-gumming solution may be conveniently prepared by dissolving the components in water. It can be supplied in a form ready for use, or it can also be provided in the form of a concentrate, which is diluted with water by the user prior to use.

Although the developing-gumming solution can also be used as its own replenisher, preferably, a specially formulated replenisher is used. In the replenisher, the concentration of base is higher than the concentration of base in the developing-gumming solution to compensate for the base consumed in the development-gumming process. Thus, a balance between developing-gumming solution drag-out and replenisher feed-in is reached. There is a correlation between the value of the electric conductivity and the alkalinity of the total developing-gumming solution bath.

The replenisher comprises the same components as the developing-gumming solution. The only difference is that the electrical conductivity of the replenisher has to be higher than that of the corresponding developing-gumming solution (i.e., the conductivity of the developing-gumming solution is lower than that of the corresponding replenisher). This is can, for instance, be obtained by having a higher concentration of the alkali metal hydroxide in the replenisher. The replenisher typically has a pH of about 11.0 to about 14.

As soon as a reduction of developing-gumming solution efficiency is detected by a lower electrical conductivity in the developing-gumming bath, replenisher is added to the developing-gumming solution until the electrical conductivity of the developing-gumming solution reaches its original value. The developing-gumming solution preferably has a conductivity of about 40 to about 80 mS/cm at 20° C. The conductivity of the replenisher is higher than that of the developer, typically from about 60 to about 120 mS/cm at 20° C.

Imageable Elements

The imageable element comprises an imageable layer on a hydrophilic substrate.

Substrate

The hydrophilic substrate, i.e., the substrate that comprises at least one hydrophilic surface, comprises a support, which may be any material conventionally used to prepare imageable elements useful as lithographic printing plates. The support is preferably strong, stable and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Metal supports include aluminum, zinc, titanium, and alloys thereof.

Although the developing-gumming solutions may be used with imageable elements that comprise any type of substrate known in the art, they are particularly well adapted for use with those that comprise an aluminum or an aluminum alloy support. The surface of the aluminum support may be treated by techniques known in the art, including physical graining, electrochemical graining, chemical graining, and anodizing. The substrate should be of sufficient thickness to sustain the wear from printing and be thin enough to wrap around a printing form, typically from about 100 to about 600 $\mu$m.

Typically, the substrate comprises an interayer between the aluminum support and the imageable layer. The interlayer may be formed by treatment of the support with, for example, silicate, dextrine, hexafluorosilicic acid, phosphate/fluoride, polyvinyl phosphonic acid (PVPA) or polyvinyl phosphonic acid copolymers.

Imageable Layer

The imageable layer comprises an imageable composition. The composition may be sensitive to ultraviolet and/or visible radiation (i.e., photoimageable), and/or it may be thermally imageable.

Positive-working photoimageable compositions are well known. They are discussed, for example, in Chapter 5 of *Photoreactive Polymers: the Science and Technology of Resists*, A. Reiser, Wiley, N.Y., 1989, pp. 178–225. These compositions comprise a water insoluble, alkali soluble binder and a material that comprises a photosensitive moiety. The photosensitive moiety may be bonded to the binder and/or be present in a separate compound.

The binder may comprise a phenolic resin, such as a novolac resin. Novolac resins are commercially available and are well known. They are typically prepared by the condensation reaction of a phenol, such as phenol, m-cresol, o-cresol, p-cresol, etc, with an aldehyde, such as formaldehyde, paraformaldehyde, acetaldehyde, etc. or ketone, such as acetone, in the presence of an acid catalyst. The weight average molecular weight is typically about 1,000 to 15,000. Typical novolac resins include, for example, phenol-formaldehyde resins, cresol-formaldehyde resins, phenol-cresol-formaldehyde resins, p-t-butylphenol-formaldehyde resins, and pyrogallol-acetone resins. Particularly useful novolac resins are prepared by reacting m-cresol, mixtures of m-cresol and p-cresol, or phenol with formaldehyde using conventional conditions.

Other phenolic resins include polyvinyl compounds having phenolic hydroxyl groups. Such compounds include, for example, resole resins, polymers of hydroxy-styrene (vinyl phenol), such as poly(p-hydroxystyrene); copolymers containing recurring units of hydroxystyrene; and polymers and copolymers containing recurring units of substituted hydroxystyrenes, such as acrylate and methacrylate copolymers of hydroxystyrene.

The binder may also be a water insoluble, base soluble polymeric compound having pendent sulfonamide groups, such as is described in Aoshima, U.S. Pat. No. 5,141,838 (EP 330,239). Particularly useful polymeric materials comprise (1) a sulfonamide monomer unit, especially N-(p-aminosulfonylphenyl)methacrylamide, N-(m-aminosulfonylphenyl)methacrylamide N-(o-aminosulfonylphenyl)methacrylamide, and/or the corresponding acrylamide, more especially N-(p-aminosulfonylphenyl)methacrylamide; (2) acrylonitrile and/or methacrylonitrile; and (3) methyl methacrylate and/or methyl acrylate.

The photosensitive moiety is typically the o-diazonaphthoquinone moiety. Compounds that contain the o-diazonaphthoquinone moiety (i.e., quinonediazides), preferably compounds that comprise an o-diazonaphthoquinone moiety attached to a ballasting moiety that has a molecular weight of at least 1500, but less than about 5000, are preferred. Typically, these compounds are prepared by the reaction of a 1,2-naphthoquinone diazide having a halogenosulfonyl group, typically a sulfonylchloride group, at the 4- or 5-position with a mono- or poly-hydroxyphenyl compound, such as mono- or poly-hydroxy benzophenone.

The phenolic resin may be derivatized with an o-diazonaphthoquinone moiety. Polymeric diazonaphthoquinone compounds include derivatized resins formed by the reaction of a reactive derivative that contains diazonaphthoquinone moiety and a polymeric material that contains a suitable reactive group, such as a hydroxyl or amino group. Suitable polymeric materials for forming these derivatized resins include the novolac resins, resole resins, polyvinyl phenols, acrylate and methacrylate copolymers of hydroxy-containing monomers such as hydroxystyrene. Representative reactive derivatives include sulfonic and carboxylic acid, ester, or amide derivatives of the diazonaphthoquinone moiety. Derivatization of phenolic resins with compounds that contain the diazonaphthoquinone moiety is well known in the art and is described, for example, in West, U.S. Pat. Nos. 5,705,308, and 5,705,322.

A mixture comprising one or more phenolic resins and/or one or more polymeric compounds having pendent sulfonamide groups may also be used as the binder in the positive-working photosensitive compositions.

Positive-working thermally imageable layers comprise a binder, a dissolution suppressor, and optionally, a photothermal conversion material. Such systems are disclosed in, for example, Parsons, WO 97/39894; Nagasaka, EP 0 823 327; Miyake, EP 0 909 627; West, WO 98/42507; and Nguyen, WO 99/11458, all of which are incorporated herein by reference. The binder is typically a phenolic resin, such as a novolac resin, as discussed above. The dissolution suppressors are believed not to be sensitive, i.e. photoreactive, themselves to radiation in the range of about 600 nm to about 800 nm and radiation in the range of about 800 nm to about 1200 nm, the radiation typically used to image a thermally imageable element.

The dissolution suppressor may be a compound that comprises an o-diazonaphthoquinone moiety, such as is discussed above. The derivatized resins that comprise an o-diazonaphthoquinone moiety can act as both the binder and the dissolution suppressor. They can be used alone, or they can be combined with other binders and/or dissolution suppressors. Other compounds useful as dissolution suppressors include, compounds that contain a positively charged (i.e., quaternized) nitrogen atom, for example, tetraalkyl ammonium compounds, quinolinium compounds, benzothiazolium compounds, pyridinium compounds, and imidazolium compounds. A preferred group of dissolution suppressors includes those that are also dyes, especially triarylmethane dyes such as ethyl violet or crystal violet. These compounds can also act as contrast or coloration dyes, which distinguishes the image regions from the non-image regions in the developed imageable element.

Alternatively, or additionally, the binder itself can comprise polar groups that act as acceptor sites for hydrogen bonding with the hydroxy groups present in the polymeric material and, thus, act as a dissolution suppressor. Using well-known methods, a portion of the hydroxyl groups of the binder can be derivatized to introduce polar groups, for example carboxylic acid esters, such as benzoate esters; phosphate esters; ethers, such as phenyl ethers; and sulfonic acid esters, such as methyl sulfonates, phenyl sulfonates, p-toluene sulfonates (tosylates), and p-bromophenyl sulfonates (brosylates).

Derivatization of the hydroxyl groups of the binder increases its molecular weight and reduces the number of hydroxyl groups, typically reducing both its solubility and rate of dissolution in the developer. Although it is important that the level of derivatization be high enough that the binder also acts as a dissolution suppressor, it should not be so high that, following thermal imaging the binder is not soluble in the developer. Although the degree of derivatization required will depend on the nature of the binder and the nature of the moiety containing the polar groups introduced into the binder, typically about 0.5 mol % to about 5 mol %, preferably about 1 mol % to about 3 mol %, of the hydroxyl groups will be derivatized. These derivatized binders can be used either alone or in combination with other polymeric materials and/or dissolution suppressors.

One preferred group of binders that comprise polar groups and function as dissolution suppressors are derivatized phenolic polymeric materials in which a portion of the phenolic hydroxyl groups have been converted to sulfonic acid esters, preferably phenyl sulfonates or p-toluene sulfonates. Derivatization can be carried by reaction of the polymeric material with, for example a sulfonyl chloride such as p-toluene sulfonyl chloride, in the presence of a base such as a tertiary amine. A preferred derivatized binder is a derivatized novolac resin in which about 1 mol % to 3 mol %, preferably about 1.5 mol % to about 2.5 mol %, of the hydroxyl groups have been converted to phenyl sulfonate or p-toluene sulfonate (tosyl) groups.

When a photothermal conversion material is present, it may comprise infrared absorber or dye bound to a phenolic material (i.e., a phenolic material derivatized with an infrared absorber or infrared absorbing dye). If an appropriate infrared absorber or dye is selected, the derivatized polymeric material can act as the binder, the dissolution suppressor, and/or the photothermal conversion material.

The imageable layer may also comprise dye to aid in the visual inspection of the imaged and/or processed element. Printout dyes are added to distinguish the exposed regions from the unexposed regions before and during processing. Contrast or coloration dyes are added to distinguish the non-image regions from the image regions in the processed element.

If the imageable element is to be imaged with infrared or near infrared radiation, the imageable layer absorbs the imaging radiation, preferably radiation in the range of about 800 nm to 1200 nm, the radiation is commonly used for imaging thermally imageable elements. An absorber called a photothermal conversion material, which absorb radiation and convert it to heat, is typically present in the imageable layer. Photothermal conversion materials may absorb ultraviolet, visible, and/or infrared radiation and convert it to heat. Although the binder may itself comprise an absorbing moiety, i.e., be a photothermal conversion material, typically the photothermal conversion material is a separate compound.

The photothermal conversion material may be either a dye or pigment, such as a dye or pigment of the squarylium, cyanine, merocyanine, indolizine, pyrylium, or metal diothiolene class. Examples of absorbing pigments are Projet 900, Projet 860, and Projet 830 (all available from the Zeneca Corp.). Carbon black pigments may also be used. Because of their wide absorption bands, carbon black-based plates can be used with multiple infrared imaging devices having a wide range of peak emission wavelengths.

Dyes, especially dyes that are soluble in the aqueous alkaline developer, are preferred to prevent sludging of the developer by insoluble material. The dye may be, for example, an indoaniline dye, oxonol dye, porphyrin derivatives, anthraquinone dye, merostyryl dye, pyrylium compound, or a squarylium derivative. Absorbing dyes are disclosed in numerous disclosures and patent applications in the field, for example, Nagasaka, EP 0,823,327; Van Damme, EP 0,908,397; DeBoer, U.S. Pat. No. 4,973,572; Jandrue, U.S. Pat. No. 5,244,771; and Chapman, U.S. Pat. No. 5,401,618.

The amount of photothermal conversion material in the imageable layer is generally sufficient to provide an optical density of at least 0.05, and preferably, an optical density of from about 0.5 to about 2 at the imaging wavelength.

In another embodiment of this invention, a negative-working, alkaline developable printing plate, typically one containing a novolac resin and/or another phenolic resin, is imagewise exposed with a suitable light source and heated to harden the exposed regions. These materials are described, for example, in Haley, U.S. Pat. No. 5,372,907; Haley, U.S. Pat. No. 5,466,557; and Nguyen, U.S. Pat. No. 5,919,601.

Haley '907 discloses a radiation-sensitive composition that is sensitive to both ultraviolet and infrared radiation. The composition comprises (1) a resole resin, (2) a novolac resin, (3) a latent Brönsted acid and (4) an infrared absorber. The solubility of the composition in an alkaline developer is both reduced in exposed regions and increased in unexposed regions by the steps of imagewise exposure to imaging radiation and heating.

Nguyen discloses radiation-sensitive compositions imageable by infrared and ultraviolet/visible radiation. These compositions comprise a thermal-activated acid generator; a crosslinking resin; a binder resin comprising a polymer containing reactive pendant groups selected from hydroxy, carboxylic acid, sulfonamide, and alkoxymethylamides; an infrared absorber; and optionally an ultraviolet/visible radiation-activated acid generator for ultraviolet/visible sensitization. The thermal-activated acid generators are typically latent Brönsted acids.

Latent Brönsted acids described in both inventions are precursors that form a Brönsted acid by thermally or photochemically initiated decomposition. Latent Brönsted acids include, for example, onium salts in which the onium cation is iodonium, sulphonium, diazonium, phosphonium, oxysulphoxonium, oxysulphonium, sulphoxonium, selenonium, arsonium, or ammonium, and the anion is a non-nucleophilic anion selected from tetrafluoroborate, hexafluorophosphate, hexafluoroantimonate, triflate, tetrakis(pentafluoro-phenyl)borate, pentafluoroethyl sulfonate, p-methyl-benzyl sulfontate, ethyl sulfonate, trifluoromethyl acetate, and pentafluoroethyl acetate. Non-ionic latent Brönsted acids include, for example, haloalkyl-substituted s-triazines, which are described, for example, in Smith, U.S. Pat. No. 3,779,778.

Imaging

Imaging may be carried out by well-known methods. When the element is "positive working," the exposed regions are removed to reveal the underlying hydrophilic surface of the substrate. When the element is "negative working," the unexposed regions are removed to reveal the underlying hydrophilic surface of the substrate.

If the element is a photoimageable element, it may be exposed to actinic radiation from a source of radiation that is absorbed by the photoreactive component or components present in the photoimageable composition. Conventional exposure sources include, for example, carbon arc lamps, mercury lamps, xenon lamps, tungsten lamps, metal halide lamps, and lasers emitting at the appropriate wavelength. Diazonaphthoquinone compounds substituted in the 5-position typically absorb at 345 nm and 400 nm. Diazonaphthoquinone compounds substituted in the 4-position typically absorb at 310 nm and 380 nm. Imagewise exposure is typically carried out through a photomask, but direct digital exposure with a laser emitting at the appropriate wavelength is also possible.

If the element is a thermally imageable element, it may be imaged or exposed with a laser or an array of lasers emitting modulated near infrared or infrared radiation in a wavelength region that is absorbed by the element. Infrared radiation, especially infrared radiation in the range of about 800 nm to about 1200 nm, is typically used for imaging a thermally imageable element. Imaging is conveniently carried out with a laser emitting at about 830 nm or at about 1056 nm. Suitable commercially available imaging devices include image setters such as a Creo Trendsetter (CREO, British Columbia, Canada) and a Gerber Crescent 42T (Gerber).

Alternatively, the thermally imageable element may be imaged or exposed using a conventional apparatus containing a thermal printing head. An imaging apparatus suitable for use in conjunction with the imageable elements includes at least one thermal head but would usually include a thermal head array, such as a TDK Model No. LV5416 used in thermal fax machines and sublimation printers. When exposure or imaging is carried out with a thermal head, it is unnecessary that the element absorb infrared radiation. However, elements that absorb infrared radiation can be exposed with a thermal head.

Processing

Imaging produces an imaged element, which comprises a latent image of exposed (imaged) and unexposed (unimaged) regions in the imageable layer. Developing the imaged element to form a developed element converts the latent image to an image by removing either the exposed or unexposed regions, revealing the hydrophilic surface of the underlying substrate.

Conventionally, the developed element is rinsed, dried, and then treated with a gum, such as gum arabic. This invention provides a method for simultaneously developing and gumming the imaged element. The imaged element is contacted with the aqueous alkaline developing-gumming solution. After the element is contacted with the developing-gumming solution, which removes either the exposed or unexposed regions of the imageable layer, the element only must be dried. Rinsing is unnecessary. Drying may be conveniently carried out by infrared radiators. No further gumming step is required.

Typically, the imaged element is contacted with the aqueous alkaline developing-gumming solution by rubbing or wiping the imageable layer with an applicator containing this solution. Alternatively, the imaged element may be brushed with the aqueous alkaline developing-gumming solution or the solution may be applied to the element by spraying the imageable layer with sufficient force to remove the non-image regions. In either instance, a developed and gummed element is produced. Preferably, the processing may be carried out in a commercially available processor, such as a TDP 60 (Kodak Polychrome Graphics) which contains only one bath for the developing-gumming solution and a drying section. Additionally, a conductivity-measuring unit can be incorporated into the processor.

Although conventional processors equipped with an immersion type developing bath, a section for rinsing with water, a gumming section, and a drying section, can be used, the rinsing step and gumming steps are unnecessary when the developing-gumming solution of this invention is used. Additional, a conductivity-measuring unit can be incorporated into the processor.

Processing of imaged elements is typically carried out at a temperature of from about 18° C. to about 28° C., for a period of from about 5 seconds to about 60 seconds.

After a certain number of imaged elements have been processed, the conductivity value falls below a predetermined level. Then the replenisher is added to the developing-gumming section. Usually about 30 mL to about 100 mL, typically about 50–80 mL, of replenisher per 1 $m^2$ of imaged element processed is necessary to keep both the volume of developing-gumming solution and its conductivity value constant.

The processed element, typically a lithographic printing member or a printing plate, comprises regions in which imageable layer has been removed revealing the underlying surface of the hydrophilic substrate, and complimentary regions in which the imageable layer has not been removed. The regions in which the imageable layer has not been removed are ink receptive. No print problems have been observed, either in the image areas or in the non-image areas of processed plates that were stored for several days at typical room temperature and humidity, i.e. at typical ambient conditions. The gum removes quickly from the processed element (i.e. the printing plate) so that it will not cause production delays, either at the beginning of the print or for a restart after a print interruption.

INDUSTRIAL APPLICABILITY

The method of the invention can be used to prepare lithographic printing plates with good hydrophilization in the non-image regions and good oleophilization in the image regions without any rinsing or further gumming after the development-gumming step. This greatly reduces the amount of water required to process the plates as well as the amount of waste water produced in the developing process. In addition, only one pressroom chemical is needed for processing of plates. In addition, because the processor does not need a rinsing section and a gumming section, a much smaller processor can be used.

The advantageous properties of this invention can be observed by reference to the following examples, which illustrate but do not limit the invention. In the specification, examples, and claims, unless indicated otherwise, all percentages are percentages by weight based on the weight of the developer.

EXAMPLES

Glossary

| | |
|---|---|
| meso-Inosit | cis-1,2,3,5-trans-4,6-hexahydroxycyclohexane (Aldrich, Milwaukee, WI, USA) |
| REWORYL ® NXS 40 | Sodium xylenesulfonate (Rewo, Steinau, Germany) |
| REWOTERIC ® AM-V | Sodium capryloamphoacetate wetting agent (Witco, Perth Amboy, NJ, USA) |
| Sorbidex 240 | Sorbitol (75 wt % aqueous solution) (Cerestar, Sas van Gent, Netherlands) |
| SYNPERONIC ® T 304 | Poloxamine 304; Polyoxyethylene, polyoxypropylene liquid block copolymer of ethylene diamine (I.C.I. Am., Wilmington, DE, USA) |
| TRILON ® B chelating agent | Tetra sodium ethylenediamine tetraacetic acid (BASF, Ludwigshafen, Germany) |

Preparation of Developers and Replenishers

The following developers and repelenishers were prepared by stirring the components together:

Developing-gumming solution 1: 71.3 kg water; 20.0 kg Sorbidex 240; 2.30 kg REWORYL® NXS 40; 6.50 kg potassium hydroxide (45 wt % aqueous solution); and 0.17 kg SYNPERONIC® 304 T.

Developer-gumming solution 2: 84.6 kg water; 14.0 kg meso-Inosit; 2.1 kg sodium hydroxide; and 0.24 kg SYNPERONIC® 304 T.

Replenisher 1: 67.6 kg water; 20.0 kg Sorbidex 240; 2.30 kg REWORYL® NXS 40: 9.90 kg potassium hydroxide (45 wt % aqueous solution); and 0.17 kg SYNPERONIC® 304 T.

Replenisher 2: 83.3 kg water; 14.0 kg meso-Inosit; 3.4 kg sodium hydroxide; and 0.24 kg SYNPERONIC® 304 T.

Processing of Positive-Working Thermal Plate

Electra Excel™ positive-working printing plates (Kodak Polychrome Graphics LLC) were cut to a size of 515×790 mm and exposed in a Trendsetter 3244 (from Creo) infra-red exposure unit using an energy of 10 W and a rotational speed of the drum of 180 rpm. Kodak Professional COLOR-FLOW® Strip (Eastman Kodak), which contains different elements for evaluating the quality of the copies, was used for evaluation.

A TDP 60 (Kodak Polychrome Graphics LLC) processor, equipped with only one immersion type bath, and a drying section, was used to develop the exposed plates. The processor was filled with 6 L of developing-gumming solution 1. Separately, a container for the replenisher 1 was attached from which a predetermined amount of replenisher per square meter of exposed plate was added to the developing-gumming bath via a pump. 15 plates per day for 8 days (plus 1 weekend interruption) were processed. At the end of the test, the developing-gumming solution in the processor contains about 3 wt % of coating components from the Electra Excel™ plates.

The following other processor parameters were kept constant in all tests: temperature of the developing-gumming bath: $(23\pm1)°$ C.; and dwell time in the developer: 45 sec. The activity of the developing-gumming solution was measured by its conductivity, which was monitored by an separately mounted Sipan 3 (Siemens) conductivity measuring unit.

The exposed and processed plates, stored 4 days at room temperature and humidity, were mounted in a sheet-fed offset press Roland Favorit (MAN) and proofed. Printing was carried out using Offset S8900 Cora black ink (Sun Chemical/Hartmann); and fountain solution containing 86 vol % plain water, 4 vol % Combifix (Hostmann/Steinberg); and 10 vol % iso-propyl alcohol (pH of the fountain solution was 5.3). Printing was interrupted after 2000 copies, and then restarted after 30 min (restart test). After further 1000 copies, the plates were fully inked in absence of the fountain solution. Then normal printing conditions were installed and the number of copies counted, which are required for a clean copy (roll-up test). To evaluate the copies produced, the following criteria were examined: reproduction of the 1 and 2 pixel elements; optical density of the solid areas (OD solid); of 95% and 50% checkerboard dots (measured with the apparatus D 19C/D196 from Gretag/Macbeth; Yule-Nielson factor 1.15); and behavior during the print proof or during restarting of the printing (ink acceptance problems of the image and non-image areas). To evaluate the print performance, following criteria were taken: ink acceptance of image areas, ink-repellent of non-image areas (toning test), number of copies needed for a clean print, ink-repellent of non-image areas after restart, lengths of run, number of copies of roll-up test.

Copy results and developing-gumming solution stability are given in Table 1. During the testing period, the conductivity data show that the activity of the developing-gumming solution can be kept constant by addition of 45 mL of replenisher $1/m^2$ of plate. After a weekend break (between days 5 and 8), 400 mL replenisher 1 was added to reach the appropriate conductivity value. The image areas are not attacked, which follows from unchanged optical densities of the solid areas. The 1 and 2 pixel elements, 95% and 50% checkerboards were all well reproduced also at the end of the test. During the test period, the developing-gumming process was not affected by either formation of foam or precipitation of insoluble materials on the bottom of the processor. Also, no objectionable redeposits at the plate were observed.

Plates processed after days 1, 5, 8, 10 and 12 did not show any irregularities in the printing test. Neither ink acceptance nor toning problems occurred. In all cases, the plates rolled up clean between 5 to 9 copies after print start. No toning at the non-image areas was observed with the restart test. The 2-pixel elements, the 50% and 95% checkerboards, and the raster points between 1% and 93% were well reproduced onto the printed paper. Distinct signs of wear in the full surfaces and raster points were observed after 80,000 copies only. With the roll-up test, it was found that 46 copies are required to reach cleanness.

TABLE 1

Data of stability and load test

| Day | $m^2$/liter | mS/cm | OD Full | 95% | 50% |
|---|---|---|---|---|---|
| start | 0 | 50 | 1.14 | 96 | 51 |
| 1 | 2 | 49.8 | 1.14 | 96 | 51 |
| 3 | 6 | 50.1 | 1.13 | 96 | 51 |
| 5 | 10 | 49.8 | 1.12 | 96 | 50 |

TABLE 1-continued

Data of stability and load test

| Day | $m^2$/liter | mS/cm | OD Full | 95% | 50% |
|---|---|---|---|---|---|
| 8 | 12 | 49.8 | 1.14 | 96 | 51 |
| 9 | 14 | 49.5 | 1.14 | 96 | 52 |
| 10 | 16 | 49.1 | 1.13 | 96 | 51 |
| 11 | 18 | 48.9 | 1.12 | 96 | 52 |
| 12 | 20 | 49.0 | 1.13 | 96 | 52 |

The processing of Electra Excel™ plates using an unloaded developing-gumming solution 2 provides the following results:

(1) The 1 and 2 pixel elements are well reproduced.
(2) The optical density for 50% was measured to be OD=51 and for 95% to be OD=96.

No problems in ink acceptance or toning during printing tests were seen. At print start, the plate rolls clean after 6 copies.

Processing of Positive-Working Printing Plates

Capricorn Gold™ positive-working printing plates (Kodak Polychrome Graphics LLC) were cut to 610×850 mm and exposed with 530 mJ/cm² of radiation from a MH-Burner metal halide lamp (Sack) under a silver halide film half-step wedge (Fogra) with a density range of 0.15 to 1.95 increments as a positive copy. An Anitec D26 processor (Kodak Polychrome Graphics LLC), equipped with only an immersion type developing-gumming bath was used to process the exposed plates. The processor was filled with 10 L of the appropriate developing-gumming solution. Separately, a container for the corresponding replenisher solution was attached, from which 30 mL of replenisher per square meter of exposed plate was added to the developing-gumming bath via a pump. The following other processing parameters were used: temperature of the processing bath $(23\pm1)°$ C., dwell time in the processing bath 25 sec.

To evaluate the copies obtained after processing, the following criteria were examined: steps of the gray wedge that are not covered at all (in the following referred to as GW), microlines that have not yet attacked (in the following referred to as ML), behavior during the print tests (as described above).

The tests using developing-gumming solution 1 and 2, and the corresponding replenisher solutions provided the following results:

(1) number of GW are GW=3 for both developers.
(2) number of ML are ML=12 for developer/finisher 1 and 12/15 for finisher 2.
(3) copies needed at print start to became clean are 7 copies.
(4) no toning at print start or restart
(5) number of copies found with the roll-up test was 48.

Comparative Example 1

The processing of Electra Excel™ positive-working thermal plate was repeated as described above, except that the commercial available developer Goldstar Plus™ (Kodak Polychrome Graphics LLC), which does not contain any polyhydroxy compounds, was used. The results of the print tests are the following:

(1) severe toning problems have been found. It was impossible to get clean copies.
(2) after about 800 impressions a strong wear of both full areas and fine raster elements was observed.

A comparison with the print results of inventive processing of positive working thermal plate shows a clear improvement of the print performance.

Comparative Example 2

The processing of Capricorn Gold™ positive-working plate was repeated as described above, except that the commercially available developer 4005 (Kodak Polychrome Graphics LLC), which does not contain any polyhydroxy compounds, was used. The results of the print tests are the following:
(1) severe toning problems have been found. It was impossible to get clean copies.
(2) after about 1100 impressions a strong wear of both full areas and fine raster elements.
A comparison with the print results of inventive processing of positive working thermal plate shows a clear improvement of the print performance.

Comparative Example 3

Electra Excel™ plates were exposed as described above. A Mercury 850 processor (Kodak Polychrome Graphics LLC) equipped with an immersion type developing bath, a section for rinsing with water, and a gumming and drying section, was used to process the imagewise exposed plates. The processor was filled with 20 L of Goldstar Plus™ developer, and the gumming section was filled with gum 850 S (Kodak Polychrome Graphics LLC). The following processor parameters were used: temperature of the developing bath: 23° C., dwell time in the developer: 45 sec.

The image areas of processed plates were not attacked as shown by the unchanged optical densities of the solid areas compared to these of non-processed plate areas. The 1 and 2 pixel elements, 95% and 50% checkerboards were all well reproduced.

Neither ink acceptance nor toning problems occurred during the print tests. The plate rolled up clean at 8 copies after print start. No toning at the non-image areas was observed with the restart test. The 2 pixel elements, the 50% and 95% checkerboards, and the raster points between 1% and 93% were well reproduced onto the printed paper. Distinct signs of wear in the full surfaces and raster points were observed after 75,000 copies only. With the roll-up test, it was found that 44 copies are required to reach cleanness.

All results correspond to these found with inventive processed plates. However, this processing requires more processing steps, needs both one more press room chemical and rinsing water.

The invention has been described in detail, with particular reference to certain preferred embodiments thereof, but it should be understood that variations and modifications may be effected within the spirit and scope of the invention.

Having described the invention, we now claim the following and their equivalents.

What is claimed is:
1. A method for forming an image, the method comprising the steps of:
(a) imaging an imageable element, the imageable element comprising an imageable layer over a hydrophilic support, and forming an imaged element comprising exposed regions and unexposed regions in the imageable layer; and
(b) simultaneously developing and gumming the imaged element by contacting the imaged element with an aqueous alkaline developing-gumming solution and removing one of the exposed regions and the unexposed regions of the imageable layer;
in which:
the aqueous alkaline developing-gumming solution comprises one or more water-soluble polyhydroxy compounds of the following structure:

in which n is 4 to 7; and
either (i) $R^1$ is hydrogen, aryl, or $CH_2OH$; and $R_2$ is hydrogen, alkyl group having 1 to 4 carbon atoms, $CH_2OR^3$ in which $R^3$ is hydrogen or an alkyl group having 1 to 4 carbon atoms, $CH_2N(R^4R^5)$ in which $R^4$ and $R^5$ are each independently hydrogen or an alkyl group having 1 to 4 carbon atoms, or $CO_2H$, or (ii) $R^1$ and $R^2$ together form a carbon—carbon single bond;
the aqueous alkaline developing-gumming solution has a pH of about 10.0 to about 14;
the one or more polyhydroxy compounds comprise about 10 wt % to about 30 wt % of the aqueous alkaline developing-gumming solution, and
the method does not comprise either a rinsing step or a further gumming step following step (b).

2. The method of claim 1 in which the exposed regions of the imageable layer are removed.

3. The method of claim 1 in which the unexposed regions of the imageable layer are removed.

4. The method of claim 1 in which (i) the imageable layer comprises at least one phenolic resin, at least one polymeric compound having pendent sulfonamide groups, or a mixture thereof and (ii) the hydrophilic support comprises aluminum or an aluminum alloy.

5. The method of claim 1 in which the imageable layer comprises a novolac resin.

6. The method of claim 1 in which (i) the imageable layer comprises a novolac resin and a compound that comprises the o-diazonaphthoquinone moiety; (ii) the substrate comprises aluminum or an aluminum alloy; (iii) the element is imaged with ultraviolet or visible radiation; (iv) the pH of the aqueous alkaline solution is about 12 to about 13.5; (v) the exposed regions are removed; and (vi) the method does not comprise either a rinsing step or a further gumming step following step (b).

7. The method of claim 1 in which (i) the imageable layer comprises a novolac resin and a dissolution suppressor; (ii) the substrate comprises aluminum or an aluminum alloy; (iii) the element is imaged thermally; (iv) the pH of the aqueous alkaline solution is about 12 to about 13.5; (v) the exposed regions are removed; and (vi) the method does not comprise either a rinsing step or a further gumming step following step (b).

8. The method of claim 7 in which the imageable layer additionally comprises a photothermal conversion material and the element is imaged with infrared or near infrared radiation.

9. The method of claim 1 in which (i) the imageable layer comprises a latent Brönsted acid; (ii) the element is heated after step (a) and before (b); (iii) the pH of the aqueous alkaline solution is about 12 to about 13.5; and (iv) the unexposed regions are removed.

10. The method of claim 1 in which the aqueous alkaline developing-gumming solution does not comprise a silicate.

11. The method of claim 1 in which $R^1$ is hydrogen or $CH_2OH$ and $R^2$ is hydrogen.

12. The method of claim 11 in which n is 5 or 6.

13. The method of claim 12 in which (i) the imageable layer comprises a novolac resin; (ii) the substrate comprises aluminum or an aluminum alloy; (iii) the pH of the aqueous alkaline solution is about 12 to about 13.5; and (iv) the exposed regions are removed.

14. The method of claim 13 in which the water-soluble polyhydroxy compound is selected from the group consisting of mannitol, sorbitol, xylitol, ribitol, and arabitol.

15. The method of claim 1 in which $R^1$ and $R^2$ together form a carbon—carbon single bond and n is 4 to 7.

16. The method of claim 15 in which (i) the imageable layer comprises a novolac resin; (ii) the substrate comprises aluminum or an aluminum alloy; (iii) the pH of the aqueous alkaline solution is about 12 to about 13.5; and (iv) the exposed regions are removed.

17. The method of claim 16 in which the water-soluble polyhydroxy compound is meso-inosit.

18. The method of claim 1 in which $R^1$ is hydrogen or $CH_2OH$, $R^2$ is $CO_2H$, and n is 5 or 6.

19. The method of claim 18 in which (i) the imageable layer comprises a novolac resin; (ii) the substrate comprises aluminum or an aluminum alloy; (iii) the pH of the aqueous alkaline solution is about 12 to about 13.5; and (iv) the exposed regions are removed.

20. The method of claim 19 in which the water-soluble polyhydroxy compound is selected from the group consisting of ribonic acid, gluconic acid, mammonic acid, and gulonic acid.

21. The method of claim 1 in which $R^1$ is hydrogen, $R^2$ is $CH_2N(R^4R^5)$ in which $R^4$ and $R^5$ are each independently hydrogen or an alkyl group having 1 to 4 carbon atoms.

22. The method of claim 21 in which $R^4$ and $R^5$ are each independently hydrogen or an alkyl group having 1 to 2 carbon atoms and n is 4 or 5.

23. The method of claim 22 in which (i) the imageable layer comprises a novolac resin; (ii) the substrate comprises aluminum or an aluminum alloy; (iii) the pH of the aqueous alkaline solution is about 12 to about 13.5; and (iv) the exposed regions are removed.

24. The method of claim 23 in which the polyhydroxy compound is selected from the group consisting of glucamine, N-methyl-glucamine, and 1-desoxy-1-(methylamino)-galactit.

25. An imaged imageable element, the element produced by the steps of:
(a) imaging an imageable element, the imageable element comprising an imageable layer over a hydrophilic support, and forming an imaged element comprising exposed regions and unexposed regions in the imageable layer; and
(b) simultaneously developing and gumming the imaged element by contacting the imaged element with an aqueous alkaline developing-gumming solution and removing one of the exposed regions and the unexposed regions of the imageable layer;
in which:
the aqueous alkaline developing-gumming solution comprises one or more water-soluble polyhydroxy compounds of the following structure:

$R^1(CHOH)_nR^2$ in which n is 4 to 7; and
either (i) $R^1$ is hydrogen, aryl, or $CH_2OH$; and $R_2$ is hydrogen, alkyl group having 1 to 4 carbon atoms, $CH_2OR^3$ in which $R^3$ is hydrogen or an alkyl group having 1 to 4 carbon atoms, $CH_2N(R^4R^5)$ in which $R^4$ and $R^5$ are each independently hydrogen or an alkyl group having 1 to 4 carbon atoms, or $CO_2H$, or (ii) $R^1$ and $R^2$ together form a carbon—carbon single bond;
the aqueous alkaline developing-gumming solution has a pH of about 10.0 to about 14;
the one or more polyhydroxy compounds comprise about 10 wt % to about 30 wt % of the aqueous alkaline developing-gumming solution, and
the method does not comprise either a rinsing step or a further gumming step following step (b).

26. The element of claim 25 in which (i) the imageable layer comprises at least one phenolic resin, at least one polymeric compound having pendent sulfonamide groups, or a mixture thereof and (ii) the hydrophilic support comprises aluminum or an aluminum alloy.

27. The element of claim 25 in which the imageable layer comprises a novolac resin.

28. The element of claim 25 in which (i) the imageable layer comprises a novolac resin and a compound that comprises the o-diazonaphthoquinone moiety; (ii) the substrate comprises aluminum or an aluminum alloy; (iii) the element is imaged with ultraviolet or visible radiation; (iv) the pH of the aqueous alkaline solution is about 12 to about 13.5; and (v) the exposed regions are removed.

29. The element of claim 25 in which (i) the imageable layer comprises a novolac resin and a dissolution suppressor; (ii) the substrate comprises aluminum or an aluminum alloy; (iii) the element is imaged thermally; (iv) the pH of the aqueous alkaline solution is about 12 to about 13.5; and (v) the exposed regions are removed.

30. The element of claim 29 in which the imageable layer additionally comprises a photothermal conversion material and the element is imaged with infrared or near infrared radiation.

31. The element of claim 25 in which (i) the imageable layer comprises a latent Brönsted acid; (ii) the element is heated after step (a) and before (b); (iii) the pH of the aqueous alkaline solution is about 12 to about 13.5; and (iv) the unexposed regions are removed.

32. The element of claim 25 in which the aqueous alkaline developing-gumming solution does not comprise a silicate.

33. The element of claim 25 in which in which $R^1$ is hydrogen or $CH_2OH$, $R^2$ is hydrogen, and n is 5 or 6.

34. The element of claim 25 in which $R^1$ and $R^2$ together form a carbon—carbon single bond and n is 4 to 7.

35. The element of claim 25 in which $R^1$ is hydrogen or $CH_2OH$, $R^2$ is $CO_2H$, and n is 5 or 6.

36. The element of claim 25 in which $R^1$ is hydrogen, $R^2$ is $CH_2N(R^4R^5)$ in which $R^4$ and $R^5$ are each independently hydrogen or an alkyl group having 1 to 2 carbon atoms, and n is 4 or 5.

* * * * *

UNITED STATES PATENT AND TRADEMARK OFFICE
CERTIFICATE OF CORRECTION

PATENT NO.    : 6,649,319 B2
DATED         : November 18, 2003
INVENTOR(S)   : Fiebag et al.

It is certified that error appears in the above-identified patent and that said Letters Patent is hereby corrected as shown below:

<u>Title page</u>,
Item [75], Inventors, after "Ulrich Fiebag," delete "Resenweg" and insert therefore
-- Rosenweg --

<u>Column 17</u>,
Line 25, delete "mammonic" and insert therefore -- mannonic --

Signed and Sealed this

Ninth Day of March, 2004

JON W. DUDAS
*Acting Director of the United States Patent and Trademark Office*